United States Patent [19]
DeLand, Jr.

[11] Patent Number: 4,752,837
[45] Date of Patent: Jun. 21, 1988

[54] DATA SYNCHRONIZER FOR USE WITH A VARIABLE RATE INPUT SOURCE

[76] Inventor: Robert S. DeLand, Jr., 4622 Bindewald Rd., Torrance, Calif. 90505

[21] Appl. No.: 799,278

[22] Filed: Nov. 19, 1985

Related U.S. Application Data

[63] Continuation of Ser. No. 545,799, Oct. 26, 1983, abandoned.

[51] Int. Cl.⁴ .......................... G11B 5/09; H03L 7/00; H03L 7/24
[52] U.S. Cl. ...................................... 360/51; 360/45; 235/449
[58] Field of Search ............................ 360/45, 51, 39; 235/449; 375/119, 110; 307/269

[56] References Cited

U.S. PATENT DOCUMENTS

| | | | |
|---|---|---|---|
| 3,815,108 | 6/1974 | McGrath | 360/51 X |
| 4,053,736 | 10/1977 | Banka et al. | 360/51 X |
| 4,083,879 | 5/1978 | Banka et al. | 235/449 |
| 4,104,682 | 8/1978 | Lehner et al. | 360/51 X |
| 4,213,039 | 7/1980 | Schasser | 235/449 |
| 4,245,264 | 1/1981 | Allen | 360/51 |
| 4,264,934 | 4/1981 | Mattes | 360/51 X |
| 4,357,707 | 11/1982 | Delury | 360/51 X |

Primary Examiner—Raymond F. Cardillo
Assistant Examiner—Alyssa H. Bowler
Attorney, Agent, or Firm—Nilsson, Robbins, Dalgarn, Berliner, Carson & Wurst

[57] ABSTRACT

A digital system is disclosed for synchronizing data in a variable-rate pulse stream, as by the intervals of a magnetic recording medium. Functionally, an estimate is made of the size of a repeatedly recorded interval and the estimate is registered. In subsequent operation, the estimate is revised whenever it is found to differ from the recorded interval, based on an allowable tolerance. The revision is by a fixed percentage of the registered estimate. An oscillator drives a down counter which is variably pre-set in accordance with the prior timing history of the pulse stream (including a substantial number of pulses). Accordingly, each cycle of the down counter provides a variable sub-interval, a predetermined number of which are counted to provide each variable synchronizing interval. Comparisons of the synchronizing interval and the pulse stream serve to adjust pre-setting of the down counter to a current value. An analog form of the system is suggested and techniques are disclosed for use of the system with various pulse code formats.

11 Claims, 3 Drawing Sheets

DATA SYNCHRONIZER FOR USE WITH A VARIABLE RATE INPUT SOURCE

This application is a continuation of Ser. No. 545,799, now abandoned, filed 10/26/83.

BACKGROUND AND SUMMARY OF THE INVENTION

The need sometimes arises to synchronize or encode data in a variable rate stream. Specifically, for example, the need arises in magnetic recording apparatus to synchronize or encode digital data for single-track, self-clocking formats.

The widespread use of magnetic recording techniques for digital data involves several different single-track format schemes as explained to some extent in U.S. Pat. No. 3,962,726. One popular format is referred to as F/2F recording in a class sometimes referred to as the Manchester codes. Other formats in which both binary data and timing information are carried by a recorded single signal are sometimes collectively referred to as non-F/2F codes.

The system of the present invention is applicable for both F/2F codes and non-F/2F codes of recording. Accordingly, the system of the present invention is applicable in a variety of systems for generating or recovering a variable-rate data stream, as in conjunction with magnetic recording apparatus.

Dynamic magnetic recording and reproducing techniques generally involve time-space relationships. That is, magnetic discontinuities are recorded along a length of magnetic medium. In sensing the medium, representative signal fluctuations are displaced in time in a direct relationship to the spacing of the magnetic discontinuities. However, assuming a direct time-space relationship presumes a constant relative speed between the magnetic medium and the sensing apparatus, e.g. the magnetic transducer head. Thus, variations in the speed of the relative motion between a length of magnetic tape and a transducer head will vary the timing relationship between signal fluctuations. In precision equipment, the critical relative speed may be quite consistent; however, in other apparatus the relative speed may vary widely producing a variable rate data stream. For example, apparatus is in widespread use for sensing a recording from a magnetic stripe on a card as it is moved manually. Such equipment requires a system for synchronizing a variable rate data stream and specifically for sensing the stream to distinguish between the signal fluctuations representative of data and those fluctuations representing synchronizing signals. Specifically, the need is for a system to sample a variable rate data stream during periods when data is manifest.

Recapitulating to some extent, magnetic stripe cards are frequently used manually in association with a transducer apparatus as for sensing or recording. Such systems must have considerable tolerance for speed variations as well as record deterioration to provide reliable intelligence. The present invention affords a reliable system for synchronizing such a data stream.

In general, synchronizing systems for variable data streams have used the time interval between the most recent synchronizing pulses as a basis for predicting the time interval between current synchronizing pulses. Although a variety of such techniques have been developed and are in widespread use, it is apparent that a radical change in the period between sync signals may cause such systems to fall out of synchronization. Such radical changes are not unusual in manual-drive equipment or where a portion of the recorded data is obliterated.

In general, the system of the present invention anticipates data signals on the basis of several prior synchronizing intervals so that the recent history of operation (rather than the past cycle) provides the basis for current observations. An estimate of the current interval is registered. If the current interval is found to coincide with the estimate (to a reasonable tolerance) the estimate is not changed. If the estimate is found to be too large or too small, it is altered by a fixed percentage of its value, e.g. three percent.

As a specific example, in the F/2F format, a timer whose time is equal to the estimated interval (bit time) is started by each synchronizing transition received. The bit is tested at a time value of ¾ estimated to confirm or deny the presence of the conditional transition, as per well known technique.

For non-F/2F format, a timer whose time is equal to the estimated interval time is started by each received transition. If no transition is received, the timer repeats itself continuously, until a transition is received to resynchronize. The bit is tested at a time value of ½ of estimated to confirm the level as high or low, as per well known technique.

In the disclosed embodiment of the present invention, the data synchronizer receives a variable rate stream to provide both data and synchronizing signals. The synchronizing signal defines variable intervals which are necessary to interpret the data. A timing means defines short sub-intervals of time which are of variable duration. A counter is associated with the timing apparatus for counting a predetermined number of the sub-intervals to define a variable sync interval. Apparatus is incorporated for varying the periods of the sub-intervals under control of the historical rate of the stream from the input source.

BRIEF DESCRIPTION OF THE DRAWINGS

The drawings, disclosing illustrative embodiments of the present invention, serve to present various objectives and advantages hereof and are as follows.

DESCRIPTION OF THE ILLUSTRATIVE EMBODIMENTS

The disclosed embodiments exemplify the invention in what is presently considered to be the best mode of operation, particularly for the purpose of explanation and illustration, recognizing of course that the invention may be embodied in various other forms some of which may be radically different from the illustrative embodiment. However, the specific structural and functional details disclosed herein are representative and provide the basis for the claims herein which define the scope of the present invention.

Figure 1:
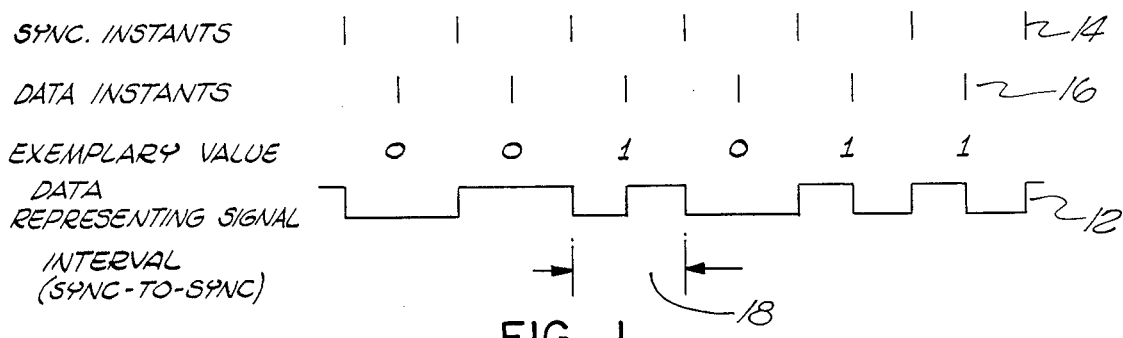
FIG. 1 is a graphic representation of a variable rate data stream for providing information in a single-track, self-clocking format.

Preliminarily, referring initially to FIG. 1, an idealized waveform 12 represents a data stream in the form of a series of discrete level changes in an electrical signal. Specifically, the representative binary signal 12 is associated with instants of time designated by time lines 14 and 16. Level changes in the signal 12 at the time instants 14 designate synchronizing data or indications while level changes at the time instants 16 manifest binary "ones". Conversely, the absence of a level change in the signal 12 at instants 16 indicate binary "zeroes". Accordingly, while sync signals are provided at the instants 14, binary values are indicated at the data instants 16. Thus, the binary number represented by the signal 12 as illustrated is, 001011.

FIG. 1 illustrates the F/2F code for data representation. In that representation, a cyclic interval may be considered as the time between a pair of adjacent sync signals (instants 14) as represented by the space 18. Thus, the space 18 represents a sync-to-sync interval containing a binary data signal. In the system of the present invention, the duration of the interval 18 is estimated and the estimate is revised by a percentage of itself as the need for correction becomes apparent. Specifics of the system include the technique for adjustably controlling the interval as well as making the initial estimate.

Figure 2:
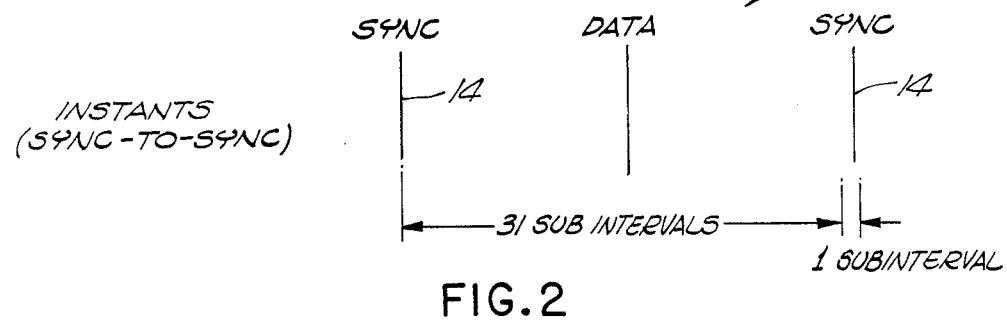
FIG. 2 is a graphic representation illustrating an enlarged fragment of the representation of FIG. 1.
Figure 3:
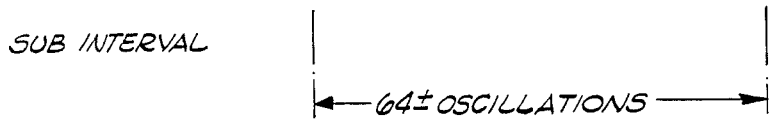
FIG. 3 is a graphic representation illustrating an enlarged fragment of the representation of FIG. 2.
Figure 5:
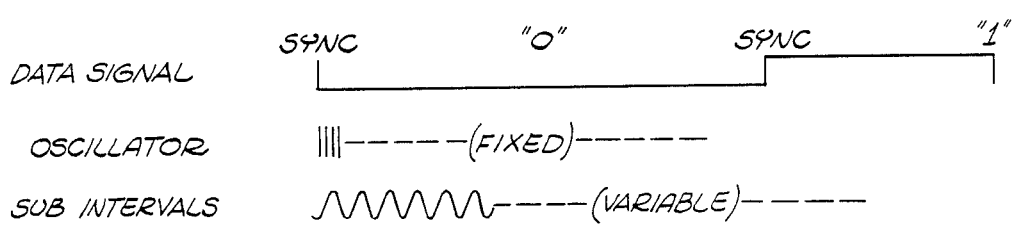
FIG. 5 is a graphic representation of certain idealized signals from the system of FIG. 4.

The sync-to-sync interval 18 is illustrated in an enlarged representation by FIG. 2. In the operation of the disclosed embodiments of the present invention, sync-to-sync interval 18 is divided into a predetermined number of sub-intervals. Specifically, for example, as disclosed in structural detail below, the sync-to-sync interval is divided into thirty-two sub-intervals, each of which is of variable duration. That is, the sync-to-sync interval 18 accommodates time variations in the data stream because the sub-intervals are of variable period although the sync-to-sync interval consistently contains a predetermined number of such sub-intervals, e.g. thirty-two. The time or periods of the sub-intervals vary from one sync-to-sync interval to another. For example, consider a single sub-interval, as represented in an enlarged form in FIG. 3. The sub-interval might be timed by an oscillator and occupy the space of a variable number of oscillations. For example, as illustrated, a sub-interval might be defined by plus or minus sixty-four oscillations. In practice, higher numbers of oscillations would normally be employed; however, referring to FIG. 3 it can be seen that as the number of oscillations varies (e.g. plus or minus sixty-four) the length of the sub-interval varies and accordingly the predetermined number of sub-intervals defining a sync-to-sync interval (FIG. 2) will similarly vary.

Figure 4:
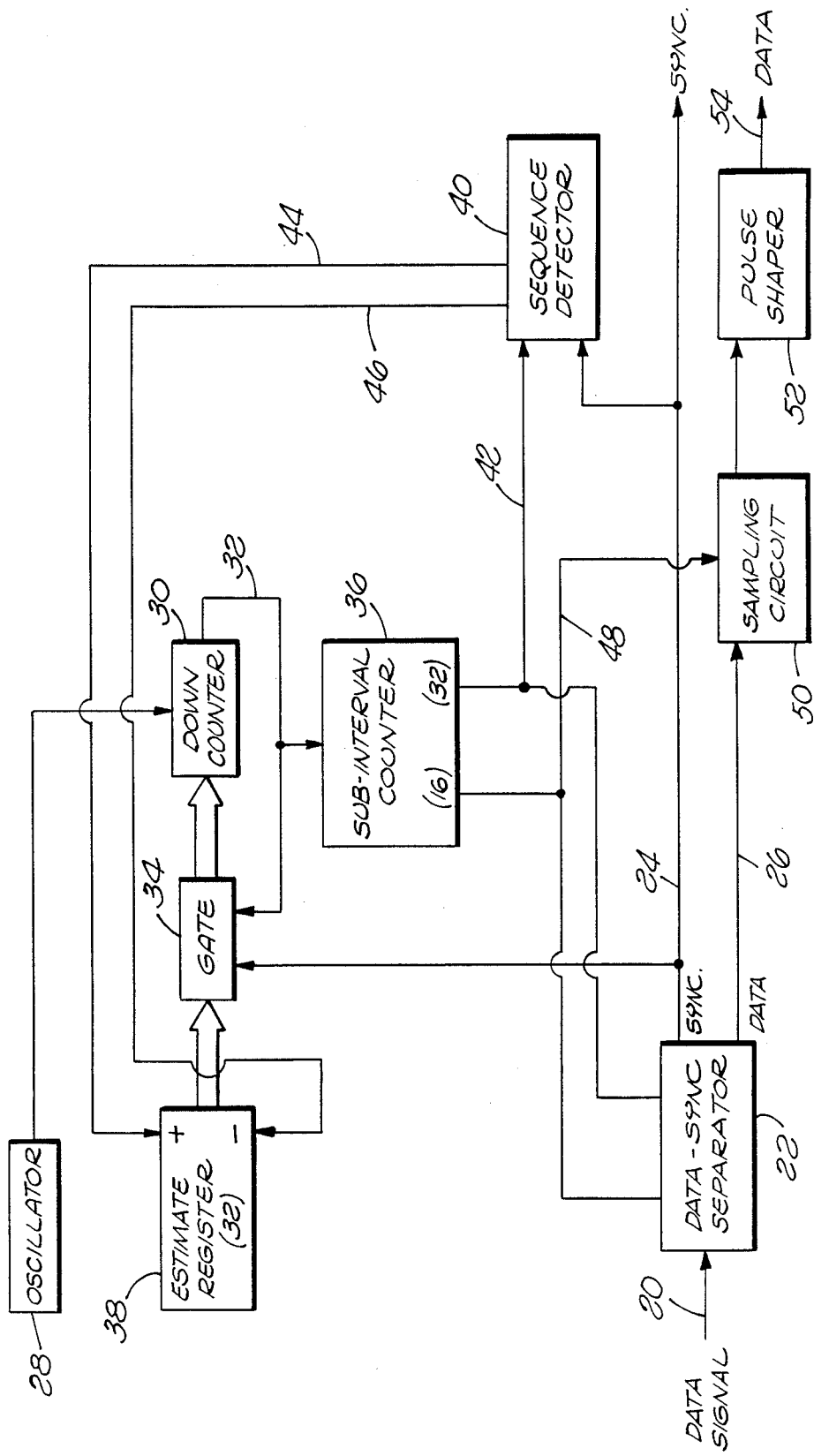
FIG. 4 is a block diagram of a system constructed in accordance with the present invention.

In view of the above preliminary explanations of timing and sequence, consideration will now be made of FIG. 4 showing certain basic elements of a system constructed in accordance with the present invention.

Data input in the form of a pulse stream is received through a conductor 20 (FIG. 4, lower left) and applied to a data-sync separator 22. The data-sync separator provides sync signals to a conductor 24 and data signals to a conductor 26 as described in greater detail below. Note that preliminary to the operations as described with respect to the system of FIG. 4, certain initializing operations are performed as well known in the art, to establish a pattern for distinguishing between sync and data signals.

As described above with respect to FIGS. 1, 2, and 3, oscillations define the basic or smallest units of time. That is, a multitude of oscillations, e.g. plus or minus sixty-four (FIG. 3) define a single sub-interval. An oscillator 28 (FIG. 4, upper left) provides such basic units of time. The oscillator 28 is connected to a down counter 30 which upon counting down to zero from a pre-set count provides a signal through a line 32 to a gate 34 and a sub-interval counter 36. The sub-interval counter tallies or counts sub-intervals to a predetermined number, e.g. thirty-two, as illustrated in FIG. 2.

The production of signals from the down counter 30 (FIG. 4) in the line 32 indicates the termination of a sub-interval. The duration of the sub-intervals varies from interval to interval, depending upon the value that is pre-set in the down counter 30 prior to each cycle of operation. That is, an initial value is provided from an estimate register 38 through the gate 34 to pre-set the down counter 30 prior to each cycle of operation. After that pre-setting operation, the oscillator 28 drives the down counter 30 until it is cleared and an output signal indicates the termination of a sub-interval. Accordingly, the duration of the sub-intervals is determined in each case by the value in the down counter 30 provided from the estimate register 38.

The sub-interval counter 36 controls the period of each sync-to-sync interval by counting sub-intervals to a predetermined number, e.g. thirty-two. The sub-interval counts of the sync-to-sync interval also provide the timing relationship for testing the data signal. In the embodiment of FIG. 4, the sampling time for a data signal is provided at the mid-count point, i.e. when the counter 36 has attained a count of sixteen. Note that it is such an instant, when the data stream is sampled for a data signal, that constitutes an essential synchronizing operation of the present system.

When the sub-interval counter 36 attains a full count, i.e. a value of thirty-two, that occurrence is compared in time relationship with the sync signal provided in the conductor 24. Specifically, the conductor 24 is connected to a sequence detector 40 along with a conductor 42 carrying a signal to indicate that a count of "thirty-two" has been attained in the sub-interval counter 36.

The sequence detector 40 provides one of a pair of binary signals in a high state depending upon which of the conductors 24 or 42 initially provides a signal. In the event that the sync signal occurs in the conductor 24 before the full count signal occurs in the conductor 42, the synchronizing operation is indicated to be slow. As a consequence, a high-level binary signal is applied through a conductor 44 to decrease the value in the estimate register 38. Conversely, if the sync signal in the conductor 24 occurs after the full count signal in the conductor 42, then the synchronizing operation is running fast. As a consequence, a high binary signal is supplied through a conductor 46 to increase the count in the register 38. Note that during an operating period of several cycles when the data stream contains consistent sync-to-sync intervals, the estimate register 38 is alternately incremented and decremented with the result that the signal in the conductor 42 alternately precedes and follows the sync signal.

In view of the above explanation relative to component parts and timing intervals, an understanding of the complete operating sequence of the system of FIG. 4 may now best be accomplished by assuming an operative state and describing the sequence through an operating cycle. Accordingly, assume that the system of FIG. 4 is locked into synchronism with a data stream or signal applied at the conductor 20 and further assume that a sync signal has just appeared in the conductor 24 from the data-sync separator 22. Such a sync signal indicates an instant 14 as illustrated in FIGS. 1 and 2.

The sync signal is applied to the gate 34 which allows the value contained in the estimate register 38 to be placed in the down counter 30. The value set in the down counter 30 equates to the desired period of a sub-interval constituting approximately one thirty-second of a sync-to-sync interval.

At the beginning of a sync-to-sync interval with the down counter 30 pre-set, the oscillator 28 drives the down counter 30 to propagate a zero signal in the line 32 which advances the sub-interval counter 36. That occurrence indicates the first sub-interval.

The signal in the line 32 is also applied to the gate 34 so that the estimated value is again provided from the estimate register 38 to pre-set the down counter 30 just as occurred preparatory to the prior sub-interval. Again, the oscillator 28 drives the down counter 30 to zero which is manifest by a signal in the line 32 and again advances the sub-interval counter 36.

The cycle of generating sub-intervals is repeated and in due course, the sub-interval counter 36 attains a count of "sixteen". At that stage, a signal is provided to a conductor 48 which is connected to both the data-sync separator 22 and a sampling circuit 50. At that time, the data signal (in conductor 26) is sampled by the sampling circuit 50 to provide a binary output to a pulse shaper 52. As illustrated in FIG. 1, and in accordance with the F/2F mode, if the binary signal received by the pulse shaper 52 involves a level change, a "one" is manifest; otherwise, a "zero" is indicated. Accordingly, data is supplied at an output 54.

After the count of "sixteen" is attained by the sub-interval counter 36, that counter continues to be advanced as additional sub-intervals are manifest by the down counter 30. In due course, the count in the sub-interval counter 36 reaches "thirty-two" with the consequence that a signal is provided in the conductor 42. Such a signal is applied to the separator 22 as a check and is also supplied to the sequence detector 40. As indicated above, the function of the detector 40 is to determine whether the timing provided by the sub-interval counter 36 is to be advanced or retarded so as to conform with the current sync-to-sync interval. Accordingly, the sync signal is supplied from the separator 22 through the conductor 24 to the detector 40 along with the full count signal from the counter 36. As described in some detail above, depending upon which of the two signals occurs first, a signal is provided in one of the conductors 44 or 46 to either increment or decrement the contents of the estimate register 38. If the value in the register 38 is increased, the period of the sub-intervals is increased because the down counter 30 begins operation at the higher count. As a consequence, the period of sub-intervals is increased. Alternatively, if the estimate register is decremented, a lower value is provided in the down counter 30 so that the period of the sub-intervals is shortened.

In the operation of the system, the estimate register 38 contains a value indicative of the period of sub-intervals, thirty-two of which will determine an historically developed period of sync-to-sync timing. Accordingly, the occurrence of a sync-to-sync interval which is extremely short is treated as a single aberration forcing only the usual small adjustment of the count. More typically, in the absence of some partial destruction of the recorded data, the deviations and variations in sync intervals tend to occur somewhat gradually and are accommodated by the system of the present invention. For example, if the sync-to-sync interval tends to become shorter, the contents of the estimate register 38 will be reduced incrementally, tracking the shortened cycles. Conversely, if the synchronizing cycle is lengthened, the register 38 is set at increasingly higher values so that longer sub-intervals are developed which in the aggregate are summarized to track the synchronizing cycles of greater duration. Thus, a sizeable number of cycles govern the sync period to provide relatively consistent operation.

Figure 7:
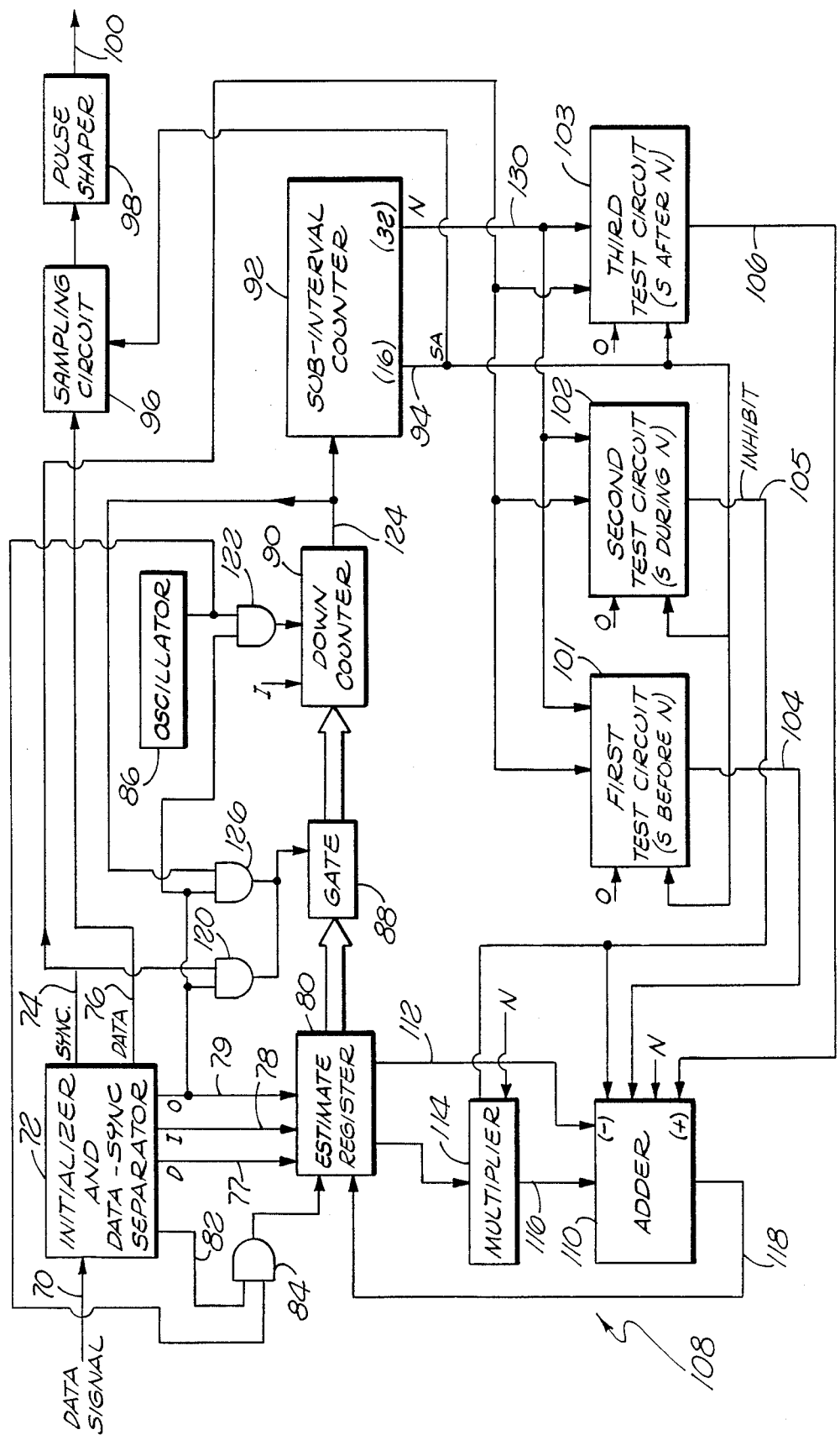
FIG. 7 is a block diagram of another system constructed in accordance with the present invention.

A more elaborate embodiment of the system of the present invention is disclosed in FIG. 7 and will now be considered in detail. A data stream is received through a conductor 70 (FIG. 7, upper left) by an initializer and data-sync separator 72. Detailed forms of such structures are well known in the prior art, and a speciiic form of an initializer is disclosed in the above-referenced U.S. Pat. No. 3,962,726 along with apparatus for separating data and sync signals.

Different forms of initializers utilize different structures depending upon the format; however, in accordance with one format which is widely employed in the field of recording magnetic stripes as on credit cards, a series of initial closely spaced pulses are provided which are followed by a code format to specify that the next following magnetic discontinuity is either sync information or data information. Such a form of initializer and separator may be employed as the separator 72 as well as any of a wide variety of alternative structures.

The initializer and separator 72 provides signals to a pair of separate conductors 74 and 76. Specifically, synchronizing or sync signals are provided to the conductor 74 and data signals are provided to the conductor 76. The format may be in accordance with the representation illustrated in FIG. 6 wherein a data signal is developed to provide separate sync and data signals.

In addition to the basic function of initializing and separating, the initializer and separator 72 also provides binary signals indicative of the state of operation. Essentially, a binary signal is high in one of three lines 77, 78, or 79 depending upon the operating state specified by the initializer and separator 72. Specifically, if the binary signal in the line 77 is high, a signal D is indicated manifesting that the system is dormant. During the initializing operation, a binary signal I is high in the line 78; and during intervals of operation, a binary signal O is high in the line 79. Of course, such binary signals may be simply developed from the logic of the initializer and separator to manifest the current operations.

In addition to the above-described signals, the initializer and separator provides a pair of spacing signals to initially set an estimate register 80. That is, time-spaced signals are provided through a conductor 82 during the initialize operation to a gate 84 (also qualified by the initialize signal) to pass signals from an oscillator 86 so as to provide an initial estimate for the sub-intervals in the estimate register 80. Functionally, the register 80 is cleared during the dormant state of the system then driven in a counting fashion during the interval specified by the spaced-apart signals provided by the initializer and separator 72. A preliminary operating value is thus provided in the register 80 which will be subsequently modified to accommodate the synchronizing operation.

During each sub-interval as described above, the contents of the estimate register 80 is shifted through a gate 88 to a down counter 90 for metering the duration or period of each individual sub-interval. Such operation is generally in accordance with that described above with reference to the system of FIG. 4. Specifically, a digital estimate of the duration of sub-intervals is provided in the estimate register 80. That estimated value is then shifted through the gate circuit 88 to the down counter 90 at the beginning of each sub-interval. The down counter 90 is driven by the oscillator 86 to meter the interval with the consequence that, at the end of each cycle, the estimate register 80 may be incrementally adjusted in the proper sense to correct for the detected deviation.

Continuing with the description of the structure of FIG. 7, the down counter 90 is connected to a sub-interval counter 92 which functions similarly to the sub-interval counter 36 as described above with reference to FIG. 4. However, while the system of FIG. 4 invariably adjusts the estimate register (depending upon the sequence in which the two observed signals occur) the system of FIG. 7 incorporates a mode of operation involving no change. Specifically, in the system of FIG. 7, the sub-interval counter 92 tallies a predetermined count, i.e. thirty-two. That is, thirty-two sub-intervals are tallied. If the sync signal occurs before the thirty-second sub-interval, the estimate in the register 80 is reduced. On the contrary, if the sync signal occurs after the thirty-second sub-interval, the estimate in the register 80 is increased. However, if the sync signal occurs during the thirty-second sub-interval, then the content of the estimate register 80 remains the same.

Figure 6:
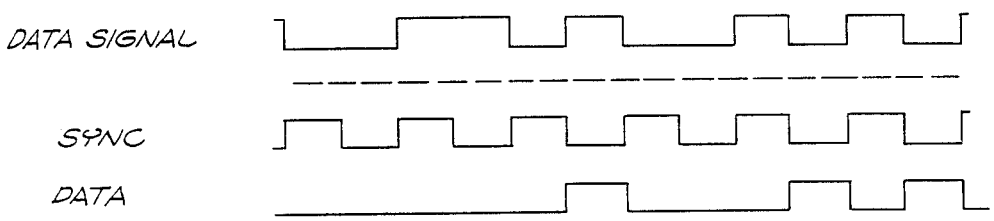
FIG. 6 is a graphic representation of other idealized signals of a system of FIG. 4.

The sub-interval counter 92 is connected to provide the high state of a binary signal SA to a conductor 94 during the sixteenth sub-interval. That signal SA serves as a sampling control and is applied to a sampling circuit 96 which is connected to receive the data signal and provides an output to a pulse shaper 98, the output 100 of which constitutes the sync signal sequence as illustrated in FIG. 6.

The signal SA (in the conductor 94, from the sub-interval counter 92) is also supplied to three test circuits 101, 102, and 103. Collectively, these circuits sense and manifest the relative times of occurrence between the sync signal SY and the thirty-second sub-interval signal N. In an alternative implementation of the system, the three circuits 101, 102, and 108 are replaced by a single composite test circuit; however, for purposes of explanation and understanding, the three separate circuits are deemed to be appropriate herein.

Each of the circuits 101, 102, and 103 has a binary output which becomes high in the event of a predetermined sequence. Specifically, the output in line 104 from the circuit 101 is high when the sync signal SY occurs before the signal N. The output in line 105 from the circuit 102 is high when the signal SY occurs during the signal N, and the output in line 106 from the circuit 103 becomes high when the signal SY occurs after the signal N. These signals are applied to circuits generally indicated at 108 for incrementing and decrementing the contents of the estimate register 80.

The content of the estimate register 80 is changed by increments of three percent of the registered value. Of course, as explained above, in the system of FIG. 7, a cycle of operations need not command a change. In accomplishing a change, the value in the estimate register 80 is applied directly to an adder 110 through a path 112. Additionally, the value of the register 80 is supplied through a multiplier 114 which reduces the value to a predetermined fraction, e.g. three percent, then supplies signals representative of the fraction to the adder 110 through a path 116. The adder 110 may function either to add or subtract the fractional value to the full value, then to provide the result back to the register 80 through a path 118.

In view of the above preliminary description of the system of FIG. 1, a complete understanding thereof may now best be accomplished by pursuing a sequence of operation and concurrently describing events in the sequence along with the introduction of additional components of the system. Accordingly, assume, for example, that the input conductor 70 is connected to receive a data stream developed by the manual movement of a magnetic stripe credit card or the like through a transducer apparatus. In accordance with one widely used format, the data stream first presents a series of initializing pulses. Prior to the occurrence of such pulses, the initializer and separator 72 is in a dormant state with the consequence that a binary signal D is high. Upon the occurrence of the initializing pulses, the initializer and separator 72 drives the signal D to a low state and the initializing signal I to a high state.

Following the closely spaced pulses, a series of sync pulses are provided as another part of the initializing operation. As a result of such sync pulses, the initializer and separator provides a time interval to qualify the gate 84 during an initial sync-to-sync interval. During that interval, the gate 84 passes signals from the oscillator 86 to pre-set the estimate register 80. Thus, during the initializing operation, the estimate register 80 is set and the initializer and separator 72 is synchronized to differentiate between sync signals and data signals. That is, the separator 72 is synchronized with the magnetic medium to provide sync signals on the conductor 74 and data signals on the conductor 76. Additionally, the register 80 is set with a count indicative of the approximate timing for sub-intervals to accomplish the approximate sub-interval timing for the intervals. Essentially during this phase of operation, the estimate register 80 is driven as a counter during a period indicated by the separator (gate 84 qualified) to attain a numerical value that is inversely related to the speed of the card through its transducer (not shown).

At the termination of the initializing interval, the initializer and separator 72 provides the initializing signal low in the line 78 and provides a high binary signal O in a line 79 to indicate the "operate" mode.

Upon the occurrence of the next sync signal in the conductor 74 (which will be followed by actual data in the conductor 76) a gate 120 is qualified to in turn actuate the gate 88. Consequently, the estimated count or value held in the register 80, is shifted into the down counter 90. Immediately thereafter, the down counter 90 begins to count downwardly as it receives oscillations from the oscillator 86 through a gate 122. The first sub-interval is thus metered.

When the down counter 90 is cleared to zero a signal is provided in a conductor 124 which commands several operations. As one operation, the signal from the down counter 90 actuates the counter 92 to count the first sub-interval. Additionally, the signal is applied from the down counter 90 to a gate 126 which in turn qualifies the gate 88 to again shift the estimate value from the register 80 into the down counter 90. Consequently, another period is initiated to meter another sub-interval. The operation continues to meter sub-intervals which are counted by the sub-interval counter 92. When the tally in the sub-interval counter 92 reaches "sixteen", a signal SA is provided in the conductor 94 to specify certain command operations. Specifically, the signal SA in the conductor 94 is applied to the sampling circuit 96 to sample the data stream in conductor 74 which times the provision of the data pulse to appear at the output 100.

The signal SA in the conductor 94 from the sub-interval counter 92 (manifesting the sixteenth sub-interval) is also applied to the test circuits 101, 102, and 103. Essentially, that operation simply alerts the test circuits during the "operate" mode to their function of sensing the relative occurrences of the sync signal SY and the counter signal N.

As the above-described timing operations are performed, the down counter 90 continues to function, ultimately driving the sub-interval counter 92 to count the "thirty-second" sub-interval. At that time, the high-level signal N is provided through a conductor 130 to each of the test circuits 101, 102, and 103. These circuits are also connected to receive the sync signal from the conductor 74. Consequently, after the occurrence of the "sixteenth" sub-interval (signal SA) the test circuits 101, 102, and 103 each await the sync signal SY and the numeric signal N to determine priority.

If the sync signal SY occurs during the signal N (manifesting the thirty-second sub-interval) the second test circuit 102 provides a signal in a line 105 which is connected to inhibit the multiplier 114 and the adder 110. In that consequence, the value in the estimate register 80 simply passes through the path 112 and the adder 110 to be returned unchanged to the register 80 through the path 118. No change is made in the value registered because the current timing is indicated to have been in the range of complete synchronism.

Considering another possibility if the sync signal SY occurs before the timing numeric signal N, then the test circuit 101 provides a signal in the line 104 which actuates the adder 110 in a "subtractive" mode. As a consequence, the contents of the register 80 is applied directly to the adder 110 through the path 112 and additionally a fraction of that value is passed from the multiplier 114 through the path 116 to the adder, the two values then being subtractively combined so that the previous contents of the estimate register 80 is reduced by a predetermined value. In practice, increments and decrements of three percent have been found particularly appropriate.

The subtractively diminished value from the adder 110 is returned to the estimate register 80 with the consequence that during the following sync-to-sync interval, the sub-intervals are of shorter duration. As a further consequence, the composite sync-to-sync interval is of shorter duration, e.g. as by three percent. Thus, the system moves incrementally to compensate existing deviations.

As a third possibility of the timing sequence, the sync signal SY may occur after the numerical signal N. In that event, the third test circuit 103 provides a signal through the line 106 to actuate the adder 110 to function in the "add" mode. In the operation that follows, the only distinction from that described above is that the contents of the estimate register 80 is incremented (rather than decremented) by a predetermined fraction, e.g. three percent. The operation is performed by the adder 110 adding the fractional value derived by the multiplier 114 to the previous content of the register 80. After such addition is accomplished, the sum is returned to the register 80 through the path 118.

The adjustment of the value in the register 80 occurs during the thirty-second sub-interval Thereafter, with the beginning of a new sync-to-sync interval, the estimate register 80 is set to indicate a current estimate for sub-increments. The sequence of events then repeats as described above to develop the next sync-to-sync interval.

It is to be noted that in the operation of the system as described herein, the sync-to-sync interval is either preserved at the previous period or is adjusted by a fixed amount. As indicated above, in one operating embodiment, a change of approximately three percent has been effective to track and maintain synchronism with a data stream. Philosophically, it is to be appreciated that this mode of operation preserves the data of several prior sync-to-sync intervals because the information developed from such intervals is changed only to a limited extent.

It is to be recognized that the down counter 90 might be operated in an analog format to provide variable sub-intervals which would be tallied by the counter 92. Such an operating format would then involve corrections to the analog form of the counter 90.

As described in some detail above, the illustrative embodiments set forth herein have been explained in relation to operation with a F/2F format. However, the system can readily be adapted to operate with other formats as the so-called non-F/2F formats. Such variations and changes may be relatively apparent to one of ordinary skill in the art, promoting one to recognize that the scope hereof should be as set forth in the following claims.

What is claimed:

1. A data synchronizing system for use with a variable rate input source to define variable sync intervals, and to provide a command signal substantially at a predetermined instant, as the midpoint of said sync intervals, said system comprising:

means for defining sub-intervals of time of a variable duration as manifest by sub-interval electrical signals;

means connected to receive said sub-interval electrical signals for counting a predetermined number of said sub-intervals to define said sync intervals;

means for varying the defined time of said sub-intervals under control of the historical rate of said input source; and means for detecting a predetermined count of said sub-interval electrical signals to provide said command signal, as substantially at said midpoint.

2. A system according to claim 1 wherein said means for varying the period of said sub-intervals comprises means for changing an existing sub-interval by a predetermined fraction of the existing sub-interval.

3. A system according to claim 1 wherein said means for defining sub-intervals of time of a variable duration comprises a digital counter means.

4. A system according to claim 1 wherein said means for counting a predetermined number of said sub-intervals further provides timing signals for comparison with said variable rate source to provide control signals for said means for varying the time of said sub-intervals.

5. A system according to claim 1 wherein said means for varying the time of said sub-intervals includes means for determining the timing sequence of said means for counting in relationship to said variable rate input source.

6. A system according to claim 5 wherein said means for varying the time of said sub-intervals includes means for varying the defined time of said sub-intervals by a fixed interval.

7. A system according to claim 5 wherein said means for varying the time of said sub-intervals includes means for varying the defined time of said sub-intervals by a predetermined fraction of last past of said sub-intervals.

8. A system according to claim 5 wherein said means for varying the period of said sub-intervals includes inhibiting means for preserving said sub-intervals unchanged.

9. A system according to claim 5 wherein said means for defining sub-intervals of time of a variable duration comprises a digital counter means.

10. A system according to claim 5 wherein said means for varying the period of said sub-intervals comprises means for changing an existing sub-interval by a predetermined fraction of the existing sub-interval.

11. A system according to claim 5 wherein said means for counting a predetermined number of said sub-intervals further provides timing signals for comparison with said variable rate source to provide control signals for said means for varying the period of said sub-intervals.

* * * * *